(12) United States Patent
Park et al.

(10) Patent No.: US 11,854,888 B2
(45) Date of Patent: Dec. 26, 2023

(54) LASER SCRIBING TRENCH OPENING CONTROL IN WAFER DICING USING HYBRID LASER SCRIBING AND PLASMA ETCH APPROACH

(71) Applicant: Applied Materials, Inc., Santa Clara, CA (US)

(72) Inventors: Jungrae Park, Santa Clara, CA (US); Zavier Zai Yeong Tan, Singapore (SG); Karthik Balakrishnan, Singapore (SG); James S. Papanu, San Rafael, CA (US); Wei-Sheng Lei, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 476 days.

(21) Appl. No.: 16/908,542

(22) Filed: Jun. 22, 2020

(65) Prior Publication Data

US 2021/0398854 A1  Dec. 23, 2021

(51) Int. Cl.
*H01L 21/78* (2006.01)
*H01L 21/67* (2006.01)
(Continued)

(52) U.S. Cl.
CPC ........ *H01L 21/78* (2013.01); *H01L 21/67069* (2013.01); *H01L 21/67115* (2013.01);
(Continued)

(58) Field of Classification Search
None
See application file for complete search history.

(56) References Cited

U.S. PATENT DOCUMENTS

| 2005/0106782 A1* | 5/2005 | Genda | B23K 26/364 438/118 |
| 2011/0177674 A1* | 7/2011 | Rodin | H01L 21/76898 438/460 |

(Continued)

FOREIGN PATENT DOCUMENTS

| CN | 110800097 A | 2/2020 |
| JP | 2013-239591 | 11/2013 |

(Continued)

OTHER PUBLICATIONS

International Preliminary Report on Patentability for Patent Application No. PCT/US2021/033613 dated Jan. 5, 2023, 7 pgs.

(Continued)

*Primary Examiner* — Erik T. K. Peterson
(74) *Attorney, Agent, or Firm* — Schwabe, Williamson & Wyatt, P.C.

(57) ABSTRACT

An embodiment disclosed herein includes a method of dicing a wafer comprising a plurality of integrated circuits. In an embodiment, the method comprises forming a mask above the semiconductor wafer, and patterning the mask and the semiconductor wafer with a first laser process. The method may further comprise patterning the mask and the semiconductor wafer with a second laser process, where the second laser process is different than the first laser process. In an embodiment, the method may further comprise etching the semiconductor wafer with a plasma etching process to singulate the integrated circuits.

7 Claims, 9 Drawing Sheets

(51) Int. Cl.
  *H01L 21/02* (2006.01)
  *H01L 21/268* (2006.01)
  *H01L 21/3065* (2006.01)

(52) U.S. Cl.
  CPC ...... *H01L 21/02071* (2013.01); *H01L 21/268* (2013.01); *H01L 21/3065* (2013.01)

(56) References Cited

U.S. PATENT DOCUMENTS

| | | | | |
|---|---|---|---|---|
| 2012/0322242 | A1* | 12/2012 | Lei | ............ H01L 21/78 |
| | | | | 156/345.31 |
| 2013/0267076 | A1* | 10/2013 | Lei | ............ B23K 26/40 |
| | | | | 438/460 |
| 2013/0309844 | A1* | 11/2013 | Takeda | ............ B23K 26/40 |
| | | | | 438/462 |
| 2014/0246153 | A1 | 9/2014 | Holden | |
| 2015/0079760 | A1* | 3/2015 | Lei | ............ H01L 21/3081 |
| | | | | 438/462 |
| 2015/0079761 | A1* | 3/2015 | Lei | ............ B23K 26/364 |
| | | | | 438/462 |
| 2015/0104929 | A1* | 4/2015 | Lei | ............ H01L 21/3083 |
| | | | | 156/345.1 |
| 2016/0315010 | A1* | 10/2016 | Van Der Stam | ..... B23K 26/364 |
| 2017/0140989 | A1* | 5/2017 | Tabuchi | ............ H01L 21/30604 |
| 2018/0197777 | A1* | 7/2018 | Karasaki | ............ H01L 21/02076 |
| 2018/0342422 | A1 | 11/2018 | Li et al. | |
| 2019/0279902 | A1* | 9/2019 | Park | ............ H01L 21/3065 |
| 2020/0294791 | A1* | 9/2020 | Okita | ............ H01L 21/78 |

FOREIGN PATENT DOCUMENTS

| | | |
|---|---|---|
| KR | 10-2012-0023258 | 3/2012 |
| TW | 201306110 A | 2/2013 |
| TW | 201706067 A | 2/2017 |
| TW | 201834057 A | 9/2018 |
| TW | 201939608 A | 10/2019 |

OTHER PUBLICATIONS

International Search Report and Written Opinion for U.S. Patent Application No. PCT/US2021/033613 dated Sep. 7, 2021, 10 pgs.
Official Letter from Taiwan Patent Application No. 110122759 dated May 4, 2023, 16 pgs.

* cited by examiner

LASER SCRIBING TRENCH OPENING CONTROL IN WAFER DICING USING HYBRID LASER SCRIBING AND PLASMA ETCH APPROACH

BACKGROUND

1) Field

Embodiments of the present disclosure pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

An embodiment disclosed herein includes a method of dicing a wafer comprising a plurality of integrated circuits. In an embodiment, the method comprises forming a mask above the semiconductor wafer, and patterning the mask and the semiconductor wafer with a first laser process. The method may further comprise patterning the mask and the semiconductor wafer with a second laser process, where the second laser process is different than the first laser process. In an embodiment, the method may further comprise etching the semiconductor wafer with a plasma etching process to singulate the integrated circuits.

In accordance with an additional embodiment disclosed herein, a method of dicing a semiconductor wafer comprising a plurality of integrated circuits is provided. In an embodiment, the method comprises forming a mask over the semiconductor wafer, and performing a first laser process to form an opening through the mask and into a device layer of the semiconductor wafer. In an embodiment, the method further comprises performing a second laser process to singulate the plurality of integrated circuits.

In accordance with an additional embodiment disclosed herein, a system for dicing a semiconductor wafer comprising a plurality of integrated circuits is provided. In an embodiment, the system comprises a factory interface, and a laser scribe apparatus coupled with the factory interface. The laser scribe apparatus comprises a laser assembly configured to provide a first laser process and a second laser process. In an embodiment, the system further comprises a plasma etch chamber coupled with the factory interface.

DETAILED DESCRIPTION

Figure 1:
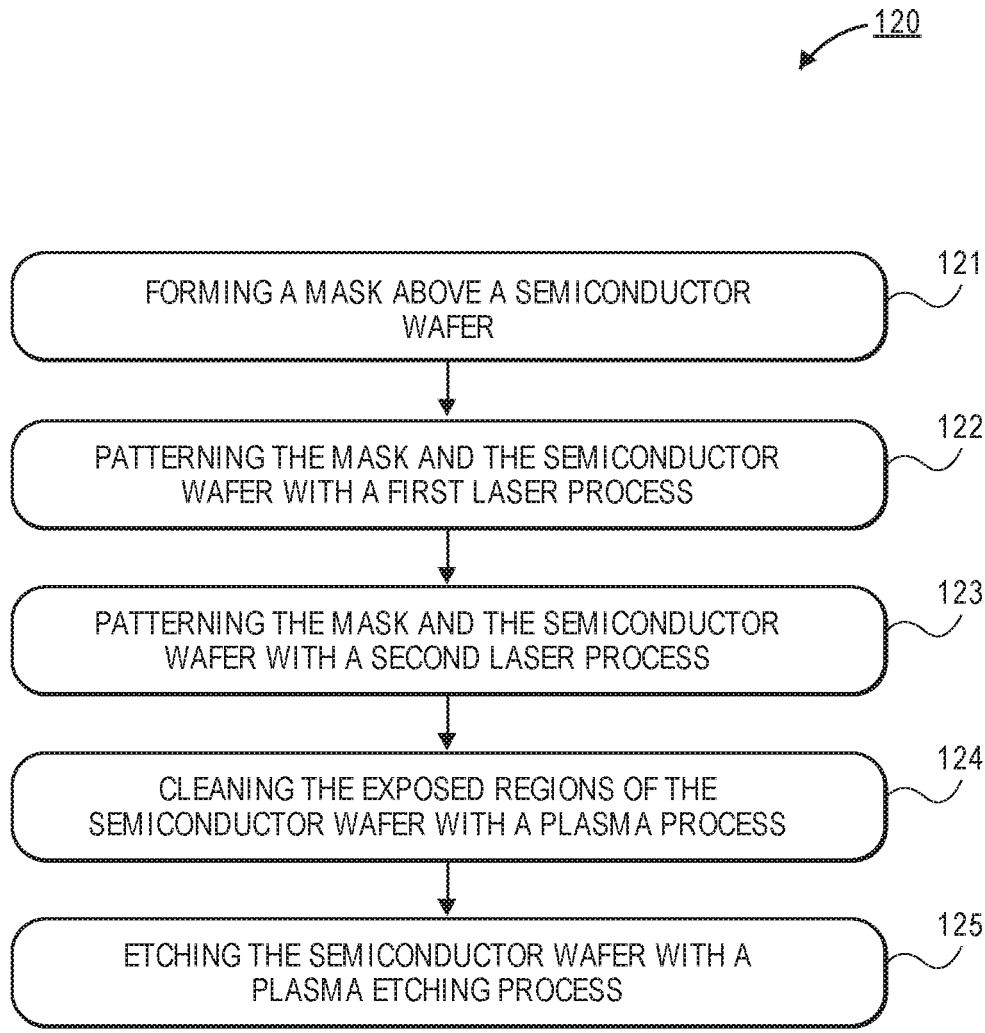
FIG. 1 is a flowchart representing operations in a method of dicing a semiconductor wafer including a plurality of integrated circuits, in accordance with an embodiment of the present disclosure.

Methods of dicing semiconductor wafers, each wafer having a plurality of integrated circuits thereon, are described. In the following description, numerous specific details are set forth, such as dual laser scribing processes and plasma etching conditions and material regimes, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. More specifically, one or more embodiments are directed to implementing a dual laser scribing process that includes a first laser process and a second laser process, e.g., for dicing applications.

Dual laser scribing processes for a hybrid laser scribing and plasma etch approach are described. For example, the dual laser scribing process may be implemented by providing a first laser scribing process with a first laser condition and a second laser scribing process with a second laser condition. The first condition and the second condition may include parameters such as laser fluence, beam size, beam polarization, and the like. Dual laser scribing processes described herein may be implemented to provide improved kerf width control of a hybrid laser scribing and plasma etching process. Embodiments may also be implemented to provide improved kerf width control of a laser dicing process. In an embodiment, the first laser scribing process sets the kerf width in a device layer of a semiconductor wafer, and the second laser scribing process widens a width of a trench through a mask layer over the device layer. In an embodiment, the second laser scribing process maintains a desired kerf width and also improves the quality of the surfaces in the device layer to prepare for subsequent plasma etching. The second laser scribing process may not significantly alter the kerf width set by the first laser scribing process.

To provide context, use of a laser for a laser scribing operation is currently implemented with a laser that forms a trench through a mask and into an underlying semiconductor wafer. The laser scribing provides a trench opening with a desired width through a mask and into the device layer of a semiconductor wafer. The desired width (i.e., a kerf width) is chosen so that the kerf width is equal to or less than a width of the streets between dies on the semiconductor wafer. However, small widths through the mask provide difficulties in the subsequent plasma etching used to singulate the dies. Accordingly, the kerf width needs to be increased to provide suitable conditions for the subsequent plasma etching.

In order to address the issue, embodiments disclosed herein include a dual laser scribing process that allows for a small kerf width in the semiconductor wafer and a widened trench through the mask layer. In an embodiment, a first laser scribing operation can be implemented at a first laser intensity to provide a first opening through the mask and into a device layer of the semiconductor wafer. A second laser scribing operation is then implemented using a second (higher) laser intensity in order to widen the trench opening through the mask layer without significantly increasing the kerf width in the device layer. The higher intensity laser may also complete the formation of the trench through the device layer to expose the underlying bulk semiconductor substrate. The kerf width is not increased since the tails of the laser pulse are substantially blocked by the mask layer.

Advantages to implementing one or more embodiments described herein may include one or more of: (1) lower kerf width, (2) increased die density on wafer, and/or (3) higher wafer yield. The lower kerf width may be obtained since the mask is subsequently etched to increase the width of the opening without needing to increase the kerf width. Accordingly, the width of the streets may be reduced and the die density is increased. Additionally, the surface of the die edge through the device layer may be made smoother by the second laser scribing operation, which results in improved plasma etching. This may result in a higher wafer yield.

In accordance with one or more embodiments of the present disclosure, a dual laser scribing process for improving the laser scribing operation in hybrid laser dicing is disclosed. As such, in an aspect of the present disclosure, a combination of dual laser scribing process with a plasma etching process may be used to dice a semiconductor wafer into singulated integrated circuits. FIG. 1 is a flowchart 120 representing operations in a method of dicing a semiconductor wafer including a plurality of integrated circuits, in accordance with an embodiment of the present disclosure. FIGS. 2A-2D illustrate cross-sectional views of a semiconductor wafer including a plurality of integrated circuits during performing of a method of dicing the semiconductor wafer, corresponding to operations of flowchart 120, in accordance with an embodiment of the present disclosure.

Figure 2A:
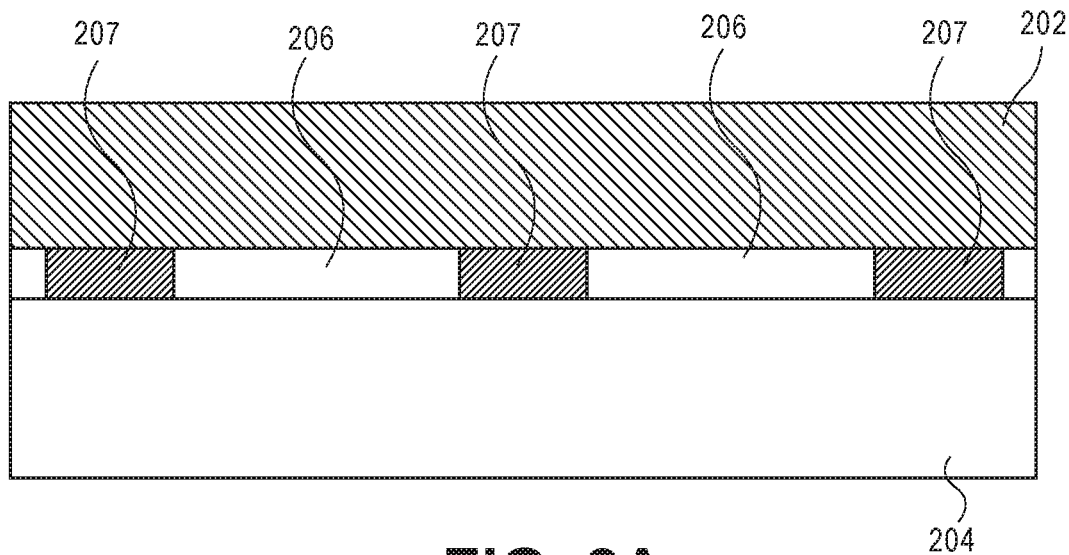
FIG. 2A illustrates a cross-sectional view of a semiconductor wafer including a plurality of integrated circuits during performing of a method of dicing the semiconductor wafer, corresponding to operation 121 of the flowchart in FIG. 1, in accordance with an embodiment of the present disclosure.

Referring to operation 121 of flowchart 120, and corresponding FIG. 2A, a mask 202 is formed above a semiconductor wafer or substrate 204. The mask 202 is composed of a layer covering and protecting integrated circuits 206 formed on the surface of semiconductor wafer 204. The mask 202 also covers intervening streets 207 formed between each of the integrated circuits 206.

In accordance with an embodiment of the present disclosure, forming the mask 202 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, forming the mask 202 involves forming a layer deposited in a plasma deposition process. For example, in one such embodiment, the mask 202 is composed of a plasma deposited Teflon or Teflon-like (polymeric $CF_2$) layer. In a specific embodiment, the polymeric $CF_2$ layer is deposited in a plasma deposition process involving the gas $C_4F_8$.

In another embodiment, forming the mask 202 involves forming a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, forming the mask 202 involves forming a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a material such as, e.g., a material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

In an embodiment, the integrated circuits 206 and the streets 207 may have a first thickness and the mask 202 may have a second thickness. The second thickness may be greater than the first thickness. For example, the first thickness may be between 3 μm and 6 μm, and the second thickness may be between 30 μm and 40 μm.

Figure 2B:
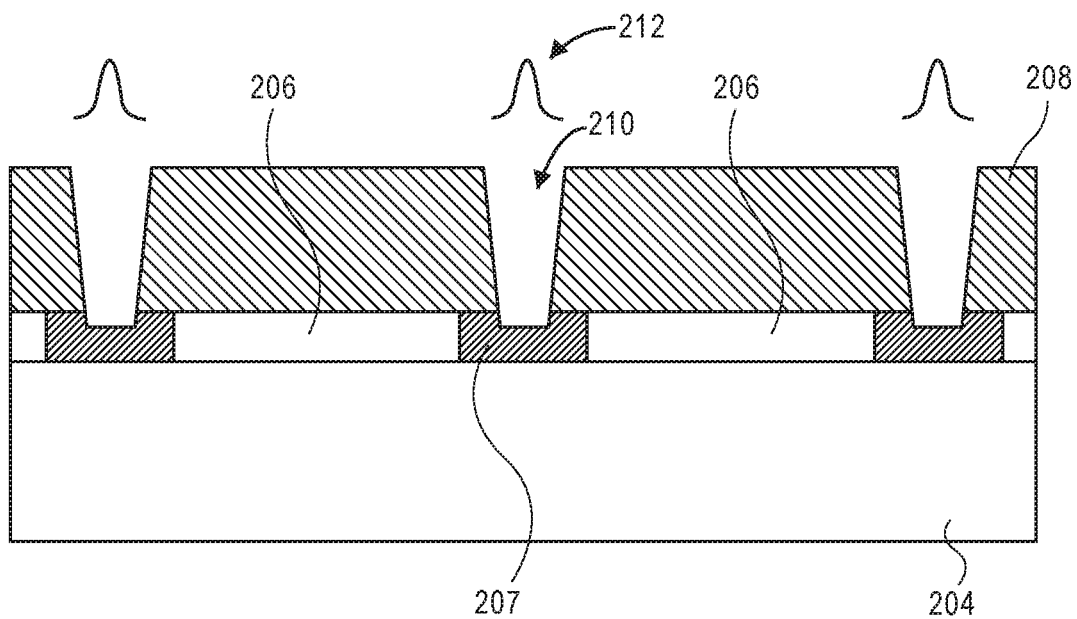
FIG. 2B illustrates a cross-sectional view of a semiconductor wafer including a plurality of integrated circuits during performing of a method of dicing the semiconductor wafer, corresponding to operation 122 of the flowchart in FIG. 1, in accordance with an embodiment of the present disclosure.

Referring to operation 122 of flowchart 120, and corresponding FIG. 2B, the mask 202 is patterned with a first laser scribing process to provide a patterned mask 208 with trenches 210. The trenches 210 may extend through the patterned mask 208 and into the streets 207. In an embodiment, there is no recession (or substantially no recession) at the interface between the patterned mask 208 and the device layer (including integrated circuits 206 and streets 207). That is, a sidewall of the trench 210 through the patterned mask 208 may be substantially coplanar with a sidewall of the trench 210 into the street 207. In some embodiments, the sidewalls of the trench 210 may be tapered (i.e., non-orthogonal to a top surface of patterned mask 208). In an embodiment, the first laser scribing process involves using a Gaussian source laser beam. In one such embodiment, the first laser scribing process involves using a femto-second source laser beam.

In an embodiment, a femtosecond-based laser is used as a source for the first laser scribing process. For example, in an embodiment, a laser with a wavelength in the visible spectrum plus the ultra-violet (UV) and infra-red (IR) ranges (totaling a broadband optical spectrum) is used to provide a femtosecond-based laser pulse, which has a pulse width on the order of the femtosecond ($10^{-15}$ seconds). In one embodiment, ablation is not, or is essentially not, wavelength dependent and is thus suitable for complex films such as films of the mask 202, the streets 207.

Laser parameters selection, such as beam profile, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 3 illustrates a cross-sectional view of a stack of materials that may be used in a street region of a semiconductor wafer or substrate, in accordance with an embodiment of the present disclosure.

Figure 3:
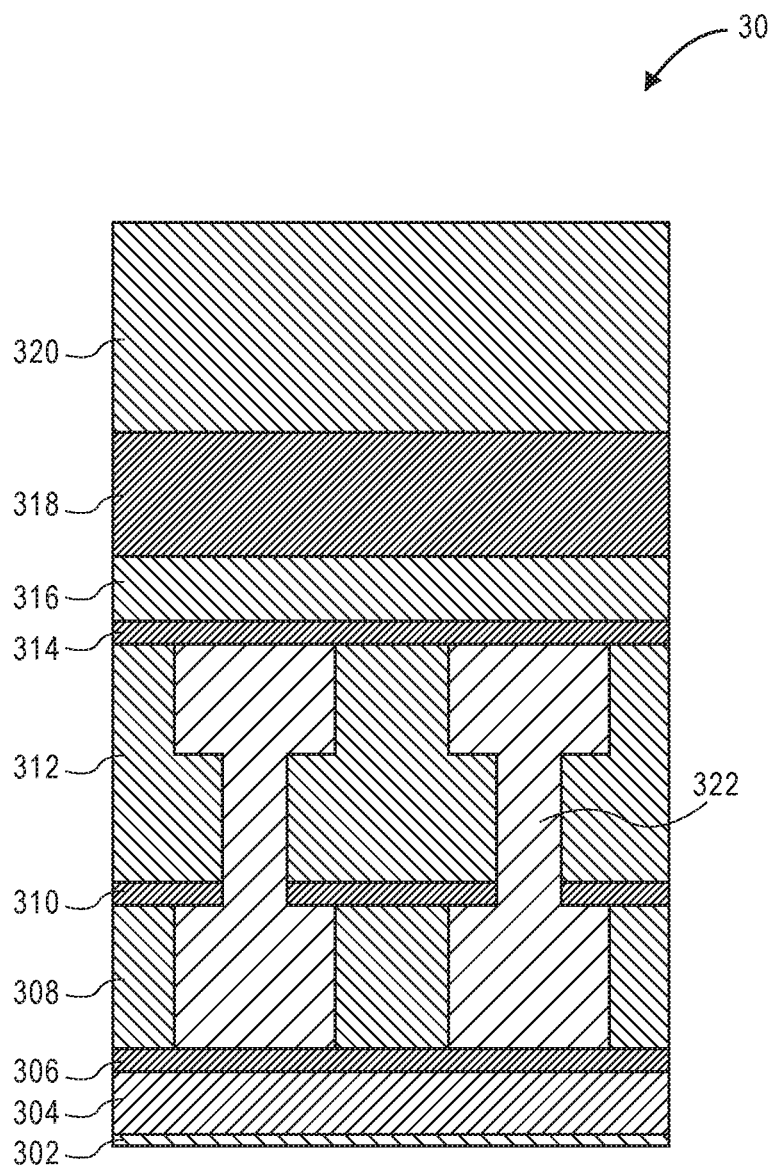
FIG. 3 illustrates a cross-sectional view of a stack of materials that may be used in a street region of a semiconductor wafer or substrate, in accordance with an embodiment of the present disclosure.

Referring to FIG. 3, a street region 300 includes the top portion 302 of a silicon substrate, a first silicon dioxide layer 304, a first etch stop layer 306, a first low K dielectric layer 308 (e.g., having a dielectric constant of less than the dielectric constant of 4.0 for silicon dioxide), a second etch stop layer 310, a second low K dielectric layer 312, a third etch stop layer 314, an undoped silica glass (USG) layer 316, a second silicon dioxide layer 318, and a layer of photoresist 320, with relative thicknesses depicted. Copper metallization 322 is disposed between the first and third etch stop layers 306 and 314 and through the second etch stop layer 310. In a specific embodiment, the first, second and third etch stop layers 306, 310 and 314 are composed of silicon nitride, while low K dielectric layers 308 and 312 are composed of a carbon-doped silicon oxide material.

In cases that the first laser beam is a femtosecond-based laser beam, in an embodiment, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In an embodiment, the laser beam may have a pulse width approximately in the range of 10 femtoseconds to 100 picoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

In an embodiment, the first laser scribing process is implemented with a first laser condition 212. The laser condition 212 may comprise a set of laser parameters used to provide a trench with a desired topography. For example, the laser condition 212 may include parameters, such as, but not limited to, pulse repetition rate, laser fluence, laser speed across the surface, and kerf width.

In an embodiment, the first laser condition 212 comprises a pulse repetition rate approximately in the range of 200 kHz to 10 MHz, although preferably approximately in the range of 500 kHz to 5 MHz. In an embodiment, the laser condition 212 delivers pulse energy at the work surface approximately in the range of 10 to 30. In an embodiment, the laser scribing process runs along a work piece surface at a speed approximately in the range of 500 mm/sec to 5 m/sec, although preferably approximately in the range of 600 mm/sec to 2 m/sec.

The first laser scribing process may be run in single pass only, or in multiple passes, but, in an embodiment, preferably 1-2 passes. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Figure 2C:
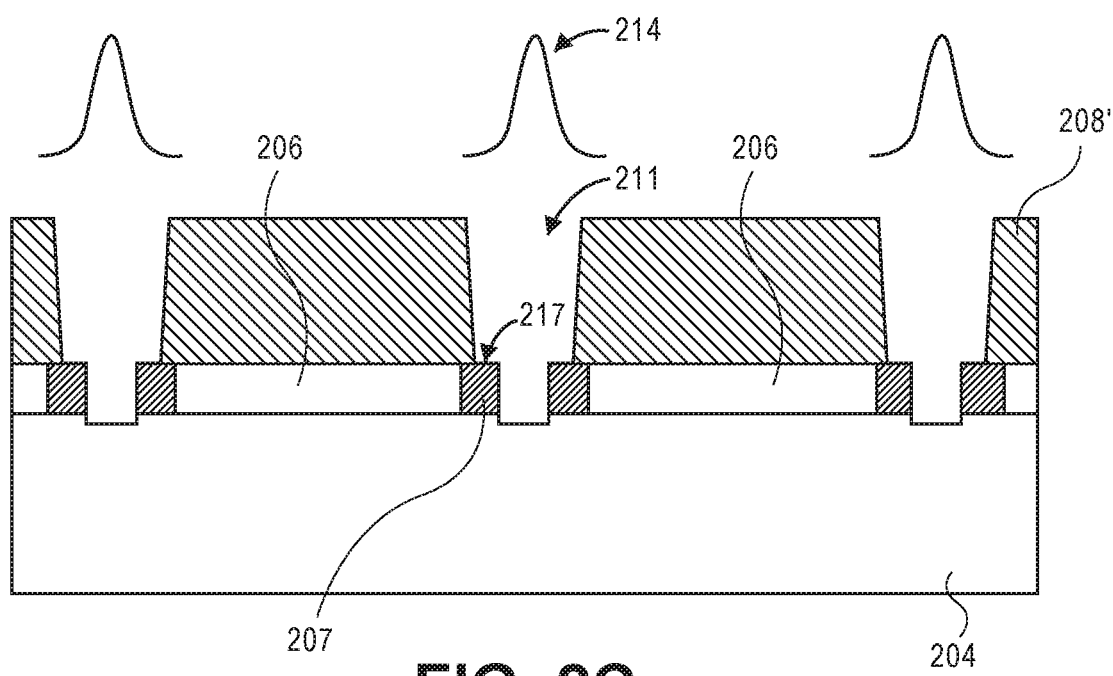
FIG. 2C illustrates a cross-sectional view of a semiconductor wafer including a plurality of integrated circuits during performing of a method of dicing the semiconductor wafer, corresponding to operation 123 of the flowchart in FIG. 1, in accordance with an embodiment of the present disclosure.

Referring to operation 123 of flowchart 120, and corresponding FIG. 2C, the mask 208 is patterned with a second laser scribing process to provide a patterned mask 208' with trenches 211. In an embodiment, the second laser scribing process is implemented with a second laser condition 214. The second laser condition of the second laser scribing process may be similar to the embodiments of the first laser condition of the first laser scribing process described, with the exception of the laser fluence. For example, the second laser condition 214 includes a laser fluence that is higher than the laser fluence of the first laser condition. For example, the laser condition 214 delivers pulse energy at the work surface approximately in the range of 60 to 80. In an embodiment, a ratio of the laser fluence between the second laser scribing process and the first laser scribing process may be approximately 3:1 or greater.

In an embodiment, the second laser scribing process increases the width of the trench 211 in the patterned mask 208'. However, the kerf width in the streets 207 is not substantially increased. Accordingly, embodiments may include a minor amount of recession of the patterned mask 208' at the interface with the street 207. For example, a portion of a top surface 217 of the street 207 may be exposed during the second laser scribing process. In an embodiment, the low-intensity tails of the pulses are blocked by the mask layer, so recession of the mask at the mask/device layer interface is minimal. In an embodiment, a minimum width of the trench 211 through the patterned mask 208' is larger than a maximum width of the trench 211 through the street 207.

In an embodiment, the second laser scribing process increases the depth of the trench 211 through the street 207. In some embodiments, the trench 211 may extend into the substrate 204 below the street 207. The second laser scribing process may also clean the surfaces of the trench 211 in some embodiments.

In an embodiment, the first laser scribing process and the second laser scribing process may be implemented with a single laser source. For example, the single laser source may make a first pass (or passes) at a first intensity, and the single laser source may make a second pass (or passes) at a second intensity. In other embodiments, a first laser source may implement the first laser scribing process, and a second laser source may implement the second laser scribing process.

Laser parameters for the first laser process and the second laser process may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. In an embodiment, the first laser scribing process and the second laser scribing process are suitable to provide such advantages.

It is to be appreciated that the dicing or singulation process could be stopped after the above described dual laser scribing process in a case that the laser scribing is used to pattern the mask as well as to scribe fully through the wafer or substrate in order to singulate the dies. Accordingly, further singulation processing would not be required in such a case. However, the following embodiments may be considered in cases where laser scribing alone is not implemented for total singulation.

Referring now to optional operation 124 of flowchart 120, an intermediate post mask-opening cleaning operation is performed. In an embodiment, the post mask-opening cleaning operation is a plasma-based cleaning process. In a first example, as described below, the plasma-based cleaning process is reactive to the regions of the substrate 204 exposed by the trenches 211. In the case of a reactive plasma-based cleaning process, the cleaning process itself may form or extend trenches 211 in the substrate 204 since the reactive plasma-based cleaning operation is at least somewhat of an etchant for the substrate 204. In a second, different, example, as is also described below, the plasma-based cleaning process is non-reactive to the regions of the substrate 204 exposed by the trenches 211.

In accordance with a first embodiment, the plasma-based cleaning process is reactive to exposed regions of the substrate 204 in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases Ar+$SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions. The approach may be suitable for photoresist or plasma-deposited Teflon masks 202, where breakthrough treatment leads to fairly uniform mask thickness reduction and a gentle Si etch. Such a breakthrough etch process, however, may not be best suited for water soluble mask materials.

In accordance with a second embodiment, the plasma-based cleaning process is non-reactive to exposed regions of the substrate 204 in that the exposed regions are not or only negligibly etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks or for thinner plasma-deposited Teflon 202. In another such embodiment, separate mask condensation and scribed trench cleaning operations are used, e.g., an Ar or non-reactive gas (or the mix) highly-biased plasma treatment for mask condensation is first performed, and then an Ar+$SF_6$ plasma cleaning of a laser scribed trench is performed. This embodiment may be suitable for cases where Ar-cleaning is not sufficient for trench cleaning due to too thick of a mask material. Cleaning efficiency is improved for thinner masks, but mask etch rate is much lower, with almost no consumption in a subsequent deep silicon etch process. In yet another such embodiment, three-operation cleaning is performed: (a) Ar or non-reactive gas (or the mix) highly-biased plasma treatment for mask condensation, (b) Ar+$SF_6$ highly-biased plasma cleaning of laser scribed trenches, and (c) Ar or non-reactive gas (or the mix) highly-biased plasma treatment for mask condensation. In accordance with another embodiment of the present disclosure, a plasma cleaning operation involves first use of a reactive plasma cleaning treatment, such as described above in the first aspect of operation 106. The reactive plasma cleaning treatment is then followed by a non-reactive plasma cleaning treatment such as described in association with the second aspect of operation 106.

Figure 2D:
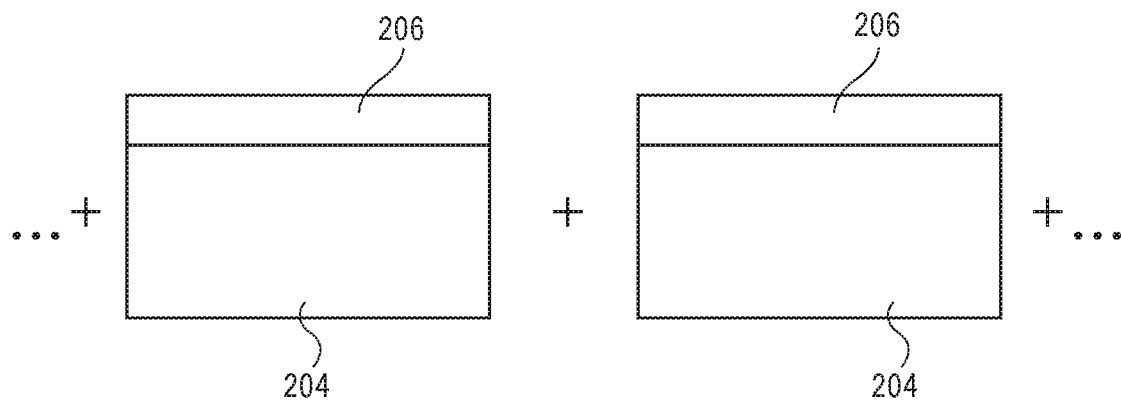
FIG. 2D illustrates a cross-sectional view of a semiconductor wafer including a plurality of integrated circuits during performing of a method of dicing the semiconductor wafer, corresponding to operation 125 of the flowchart in FIG. 1, in accordance with an embodiment of the present disclosure.

Referring to operation 125 of flowchart 120, and corresponding FIG. 2D, the semiconductor wafer 204 is etched through the gaps 210 in the patterned mask 208 to singulate the integrated circuits 206. In accordance with an embodiment of the present disclosure, etching the semiconductor wafer 204 includes ultimately etching entirely through semiconductor wafer 204, as depicted in FIG. 2D, by etching the trenches 211 initially formed with the dual laser scribing process.

In an embodiment, patterning the mask with the laser scribing process involves forming trenches in the regions of the semiconductor wafer between the integrated circuits, and plasma etching the semiconductor wafer involves extending the trenches to form corresponding trench extensions. In one such embodiment, each of the trenches has a width, and each of the corresponding trench extensions has the width.

In accordance with an embodiment of the present disclosure, the resulting roughness of mask opening from laser scribing can impact die sidewall quality resulting from the subsequent formation of a plasma etched trench. Lithographically opened masks often have smooth profiles, leading to smooth corresponding sidewalls of a plasma etched trench. By contrast, a conventional laser opened mask can have a very rough profile along a scribing direction if improper laser process parameters are selected (such as spot overlap, leading to rough sidewall of plasma etched trench horizontally). Although the surface roughness can be smoothened by additional plasma processes, there is a cost and throughput hit to remedying such issues. Accordingly, embodiments described herein may be advantageous in providing a smoother scribing process and/or more reliable trench formation process from the laser scribing portion of the singulation process.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, CA, USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the mask layer 208' is removed after the singulation process, as depicted in FIG. 2D. In another embodiment, the plasma etching operation described in association with FIG. 2D employs a conventional Bosch-type dep/etch/dep process to etch through the substrate 204. Generally, a Bosch-type process consists of three sub-operations: deposition, a directional bombardment etch, and isotropic chemical etch which is run through many iterations (cycles) until silicon is etched through.

Accordingly, referring again to flowchart 120 and FIGS. 2A-2D, wafer dicing may be performed by initial ablation using a dual laser scribing process to ablate through a mask layer, through wafer streets (including metallization), and partially into a silicon substrate. Die singulation may then be completed by subsequent through-silicon deep plasma etching. A specific example of a materials stack for dicing is described below in association with FIGS. 4A-4E, in accordance with an embodiment of the present disclosure.

Figure 4A:
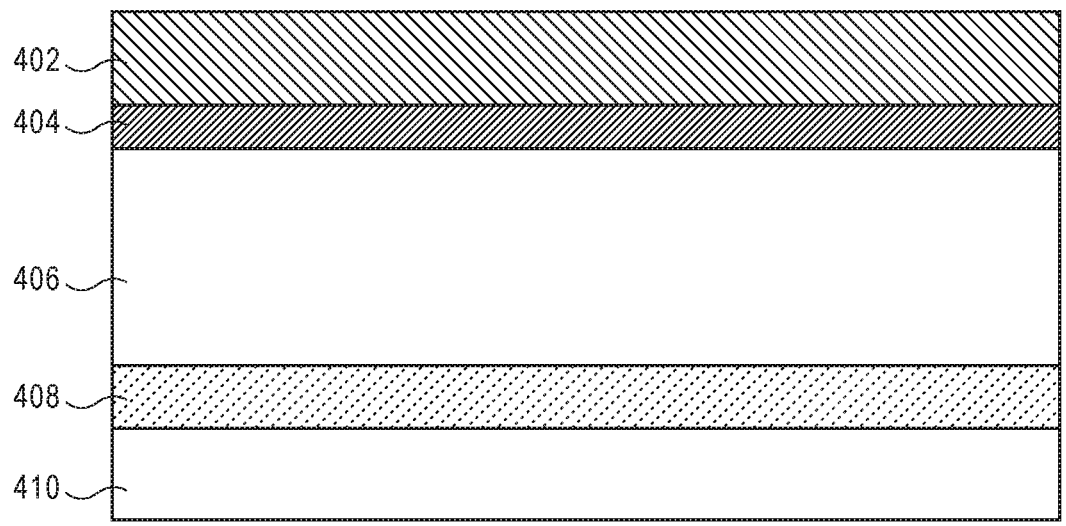
FIGS. 4A-4E illustrate cross-sectional views of various operations in a method of dicing a semiconductor wafer, in accordance with an embodiment of the present disclosure.

Referring to FIG. 4A, a materials stack for hybrid laser ablation and plasma etch dicing includes a mask layer 402, a device layer 404, and a substrate 406. The mask layer, device layer, and substrate are disposed above a die attach film 408 which is affixed to a backing tape 410. In an embodiment, the mask layer 402 is a water soluble layer such as the water soluble layers described above in association with mask 202. The device layer 404 includes an inorganic dielectric layer (such as silicon dioxide) disposed above one or more metal layers (such as copper layers) and one or more low K dielectric layers (such as carbon-doped oxide layers). The device layer 404 also includes streets arranged between integrated circuits, the streets including the same or similar layers to the integrated circuits. The substrate 406 is a bulk single-crystalline silicon substrate.

In an embodiment, the bulk single-crystalline silicon substrate 406 is thinned from the backside prior to being affixed to the die attach film 408. The thinning may be performed by a backside grind process. In one embodiment, the bulk single-crystalline silicon substrate 406 is thinned to a thickness approximately in the range of 50-100 microns. It is important to note that, in an embodiment, the thinning is performed prior to a laser ablation and plasma etch dicing process. In an embodiment, the photo-resist layer 402 has a thickness of approximately 30 microns to 40 microns and the device layer 404 has a thickness approximately in the range of 2-6 microns. In an embodiment, the die attach film 408 (or any suitable substitute capable of bonding a thinned or thin wafer or substrate to the backing tape 410) has a thickness of approximately 20 microns.

Figure 4B:
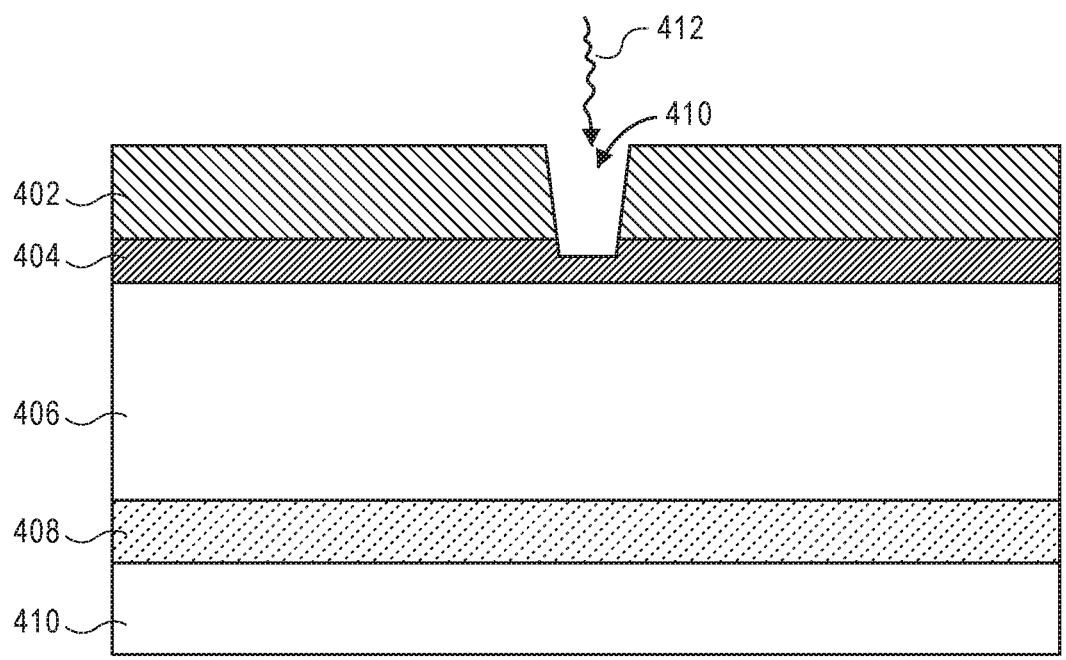

Referring to FIG. 4B, the mask 402 and a portion of the device layer 404 are patterned with a first laser scribing process 412 to form trenches 410. In an embodiment, the first laser scribing process 412 has a first laser condition. In a particular embodiment, the first laser condition delivers pulse energy at the work surface approximately in the range of 20 to 30. The trench 410 may have a tapered sidewall profile, and the sidewall of the trench 410 within the device layer 404 may be substantially coplanar with a sidewall of the trench in the mask 402.

Figure 4C:
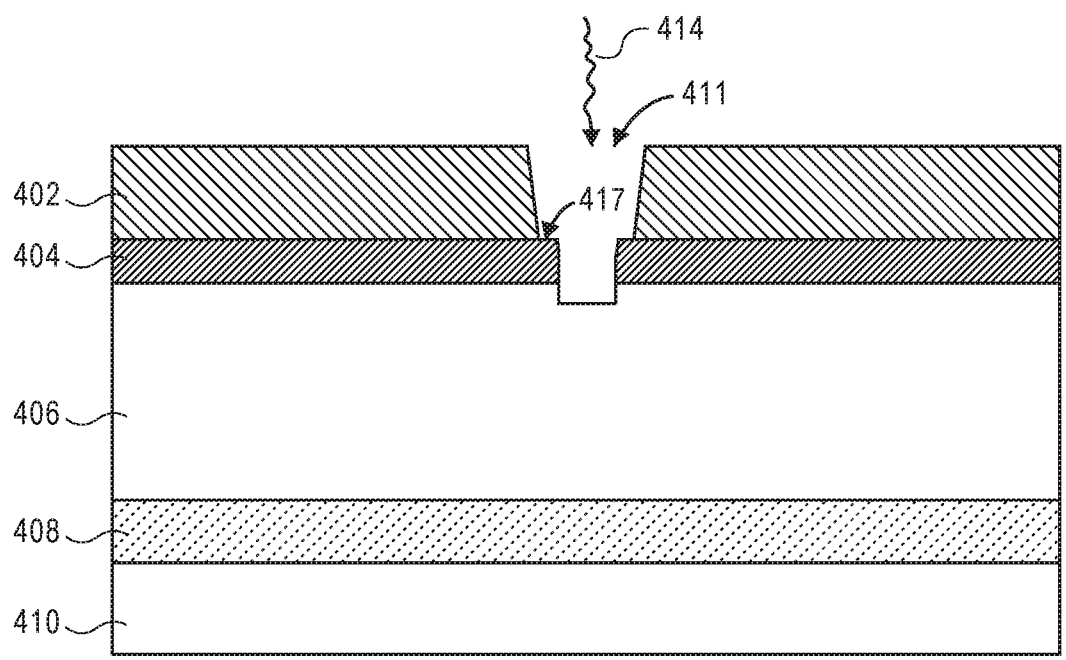

Referring to FIG. 4C, a second laser scribing process 414 is implemented to widen the trench 410 in the mask 402 and extend the trench 410 through the device layer 404. The modified trench 411 may also extend into the silicon substrate 406. In an embodiment, the second laser scribing process 414 is implemented with a second laser condition. In a particular embodiment, the second laser condition delivers pulse energy at the work surface approximately in the range of 6 μJ to 8 μJ. In an embodiment a ratio of the fluence of the second laser condition to the fluence of the first laser condition may be approximately 3:1 or greater.

In an embodiment, the second laser scribing process increases the width of the trench 411 in the patterned mask 402. However, the kerf width in the device layer 404 is not substantially increased. Accordingly, embodiments may include a minor amount of recession of the patterned mask 402 at the interface with the device layer 404. For example, a portion of a top surface 417 of the device layer 404 may be exposed during the second laser scribing process. In an embodiment, the low-intensity tails of the pulses are blocked by the mask layer, so recession of the mask at the mask/device layer interface is minimal. In an embodiment, a minimum width of the trench 411 through the mask 402 is larger than a maximum width of the trench 411 through the device layer 404.

Figure 4D:
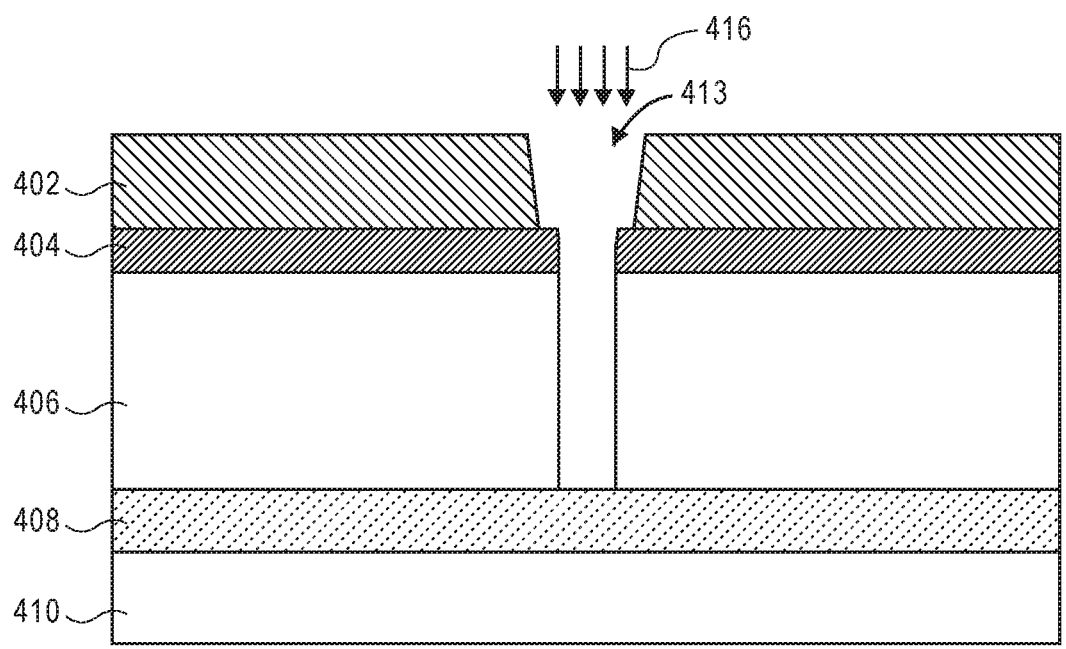

Referring to FIG. 4D, a through-silicon deep plasma etch process 416 is used to extend the trench 413 down to the die attach film 408, exposing the top portion of the die attach film 408 and singulating the silicon substrate 406. The device layer 404 is protected by the mask layer 402 during the through-silicon deep plasma etch process 416.

Figure 4E:
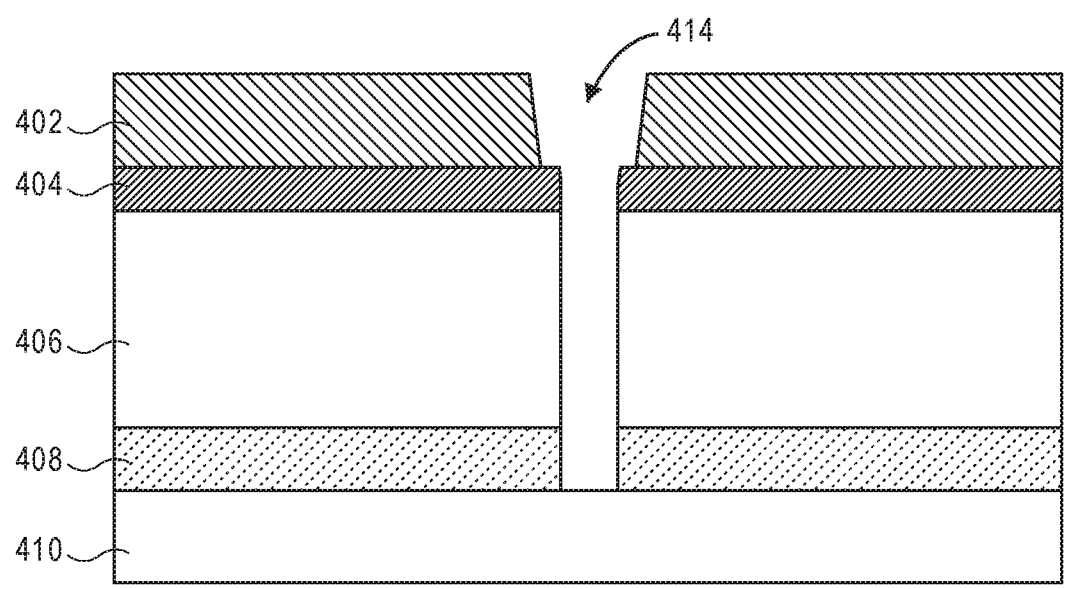

Referring to FIG. 4E, the singulation process may further include patterning the die attach film 408, exposing the top portion of the backing tape 410 and singulating the die attach film 408. In an embodiment, the die attach film is singulated by a laser process or by an etch process. Further embodiments may include subsequently removing the singulated portions of substrate 406 (e.g., as individual integrated circuits) from the backing tape 410. In one embodiment, the singulated die attach film 408 is retained on the back sides of the singulated portions of substrate 406. Other embodiments may include removing the mask layer 402 from the device layer 404. In an alternative embodiment, in the case that substrate 406 is thinner than approximately 50 microns, the dual laser scribing process 412/414 is used to completely singulate substrate 406 without the use of an additional plasma process.

A single process tool may be configured to perform many or all of the operations in an dual laser scribing ablation and plasma etch singulation process. For example, FIG. 5 illustrates a block diagram of a tool layout for laser and plasma dicing of wafers or substrates, in accordance with an embodiment of the present disclosure.

Figure 5:
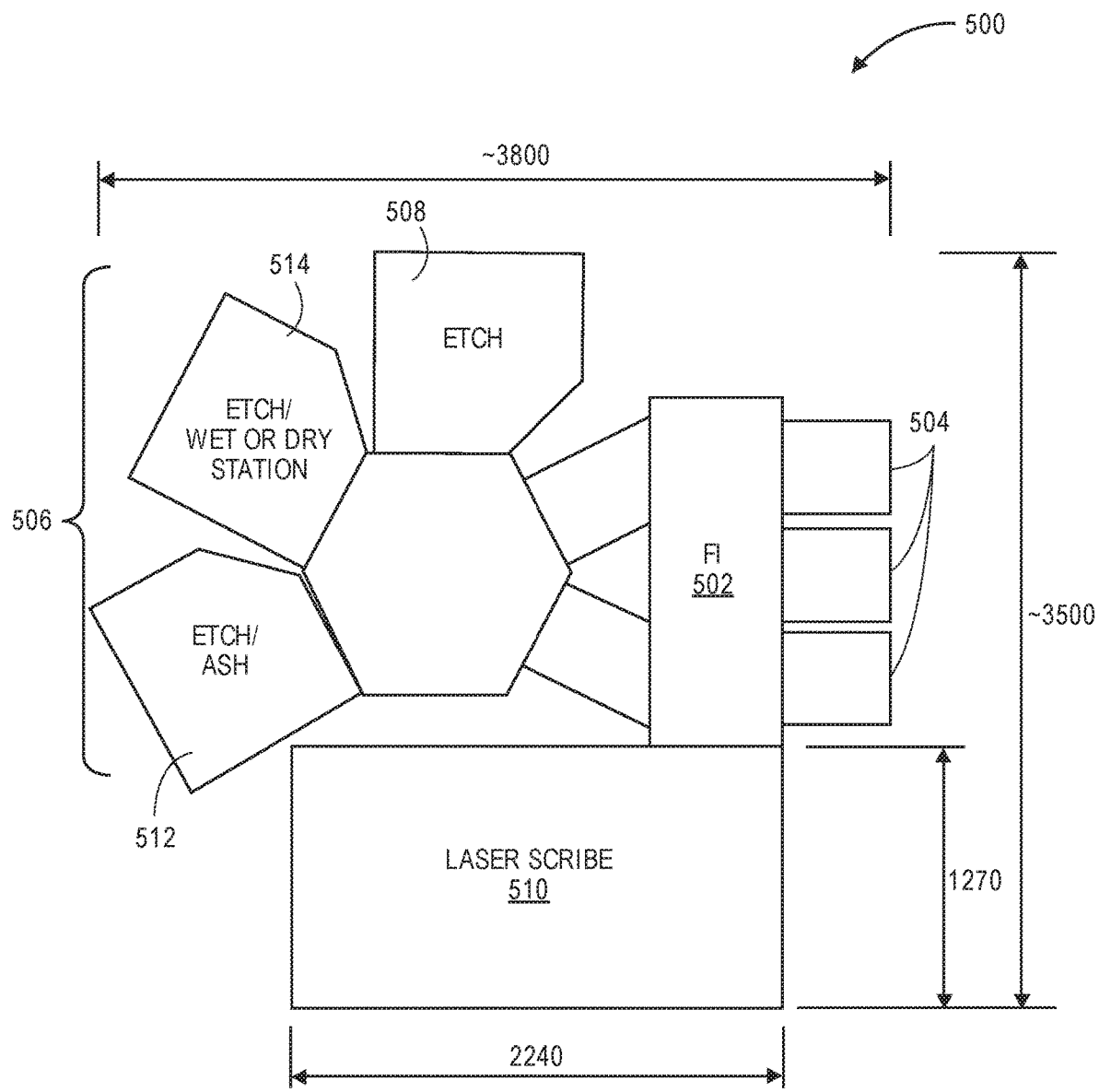
FIG. 5 illustrates a block diagram of a tool layout for laser and plasma dicing of wafers or substrates, in accordance with an embodiment of the present disclosure.

Referring to FIG. 5, a process tool 500 includes a factory interface 502 (FI) having a plurality of load locks 504 coupled therewith. A cluster tool 506 is coupled with the factory interface 502. The cluster tool 506 includes one or more plasma etch chambers, such as plasma etch chamber 508. A laser scribe apparatus 510 is also coupled to the factory interface 502. The overall footprint of the process tool 500 may be, in one embodiment, approximately 3500 millimeters (3.5 meters) by approximately 3800 millimeters (3.8 meters), as depicted in FIG. 5.

In an embodiment, the laser scribe apparatus 510 houses a laser assembly configured to provide a dual laser scribing process. In one such embodiment, the laser assembly is configured to provide a first laser scribing process with a first laser condition, and a second laser scribing process with a second laser condition. The first laser condition sets the kerf width in a device layer of a semiconductor wafer, and the second laser condition increases a width of a trench through a mask layer over the device layer. The second laser condition may not significantly increase the kerf width in the device layer. In an embodiment, the laser assembly includes a Gaussian source laser beam. In an embodiment, the laser assembly includes a femto-second source laser beam.

In an embodiment, the laser is suitable for performing a laser ablation portion of a hybrid laser and etch singulation process, such as the laser ablation processes described above. In one embodiment, a moveable stage is also included in laser scribe apparatus 510, the moveable stage configured for moving a wafer or substrate (or a carrier thereof) relative to the laser. In a specific embodiment, the laser is also moveable. The overall footprint of the laser scribe apparatus 510 may be, in one embodiment, approximately 2240 millimeters by approximately 1270 millimeters, as depicted in FIG. 5.

In an embodiment, the one or more plasma etch chambers 508 is configured for etching a wafer or substrate through the gaps in a patterned mask to singulate a plurality of integrated circuits. In one such embodiment, the one or more plasma etch chambers 508 is configured to perform a deep silicon etch process. In a specific embodiment, the one or more plasma etch chambers 508 is an Applied Centura® Silvia™ Etch system, available from Applied Materials of Sunnyvale, CA, USA. The etch chamber may be specifically designed for a deep silicon etch used to singulate integrated circuits housed on or in single crystalline silicon substrates or wafers. In an embodiment, a high-density plasma source is included in the plasma etch chamber 508 to facilitate high silicon etch rates. In an embodiment, more than one etch chamber is included in the cluster tool 506 portion of process tool 500 to enable high manufacturing throughput of the singulation or dicing process.

The factory interface 502 may be a suitable atmospheric port to interface between an outside manufacturing facility with laser scribe apparatus 510 and cluster tool 506. The factory interface 502 may include robots with arms or blades for transferring wafers (or carriers thereof) from storage units (such as front opening unified pods) into either cluster tool 506 or laser scribe apparatus 510, or both.

Cluster tool 506 may include other chambers suitable for performing functions in a method of singulation. For example, in one embodiment, in place of an additional etch chamber, a deposition chamber 512 is included. The deposition chamber 512 may be configured for mask deposition on or above a device layer of a wafer or substrate prior to laser scribing of the wafer or substrate. In one such embodiment, the deposition chamber 512 is suitable for depositing a photo-resist layer. In another embodiment, in place of an additional etch chamber, a wet/dry station 514 is included. The wet/dry station may be suitable for cleaning residues and fragments, or for removing a mask, subsequent to a laser scribe and plasma etch singulation process of a substrate or wafer. In yet another embodiment, in place of an additional deep silicon etch chamber, a plasma etch chamber is included and is configured for performing a plasma-based cleaning process. In an embodiment, a metrology station is also included as a component of process tool 500.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with process tool 500 described in association with FIG. 5. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
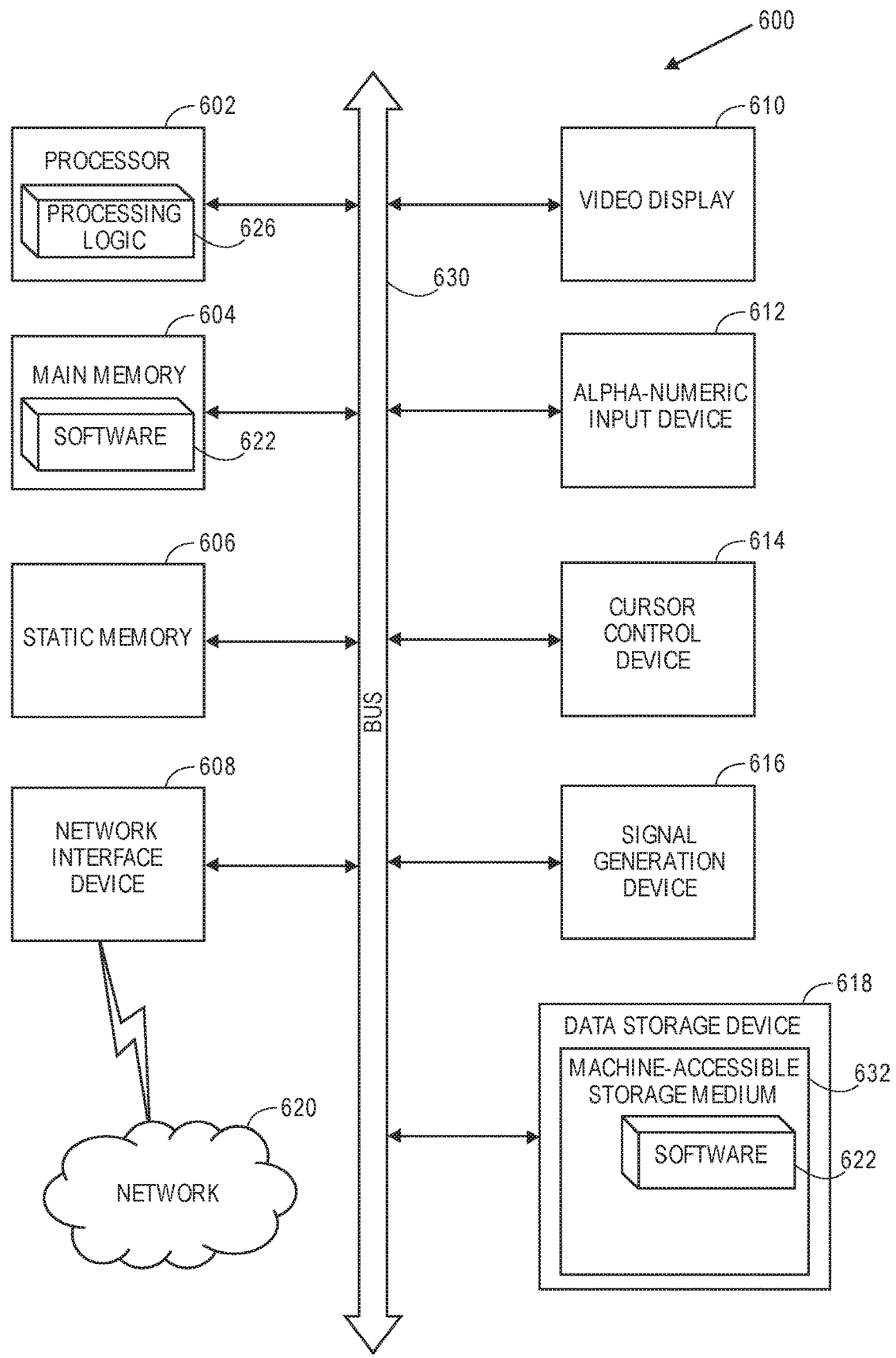
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), MRAM, etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The mask is then patterned with an dual laser scribing process to provide a patterned mask with gaps, exposing regions of the semiconductor wafer between the integrated circuits. The semiconductor wafer is then plasma etched through the gaps in the patterned mask to singulate the integrated circuits.

Thus, hybrid wafer dicing approaches using dual laser scribing process and plasma etch process have been disclosed.

What is claimed is:

1. A method of dicing a semiconductor wafer comprising a plurality of integrated circuits, the method comprising:
    forming a mask above the semiconductor wafer;
    patterning the mask and the semiconductor wafer with a first laser process wherein the first laser process forms an opening through the mask and into a device layer of the semiconductor wafer;
    patterning the mask and the semiconductor wafer with a second laser process, wherein the second laser process is different than the first laser process, wherein the second laser process extends the opening through the device layer, and wherein the second laser process widens the opening in the mask but does not widen the opening in the device layer; and
    etching the semiconductor wafer with a plasma etching process to singulate the integrated circuits.

2. The method of claim 1, wherein the first laser process has a first fluence and the second laser process has a second fluence, and wherein the second fluence is greater than the first fluence.

3. The method of claim 2, wherein a ratio of the second fluence to the first fluence is approximately 3:1 or greater.

4. The method of claim 1, wherein the second laser process has an energy of approximately 6 µJ or greater, and wherein the first laser process has an energy of approximately 3 µJ or smaller.

5. The method of claim 1, wherein there is substantially no recession at an interface between the mask and the semiconductor wafer after the first laser process.

6. The method of claim 1, further comprising:
    a plasma cleaning operation between the second laser process and the plasma etching process.

7. The method of claim 1, wherein the first laser process has a pulse width between 10 femtoseconds and 100 picoseconds.

* * * * *